(12) United States Patent
Zimmerman

(10) Patent No.: US 9,219,461 B2
(45) Date of Patent: Dec. 22, 2015

(54) CAPACITIVE BLIND-MATE MODULE INTERCONNECTION

(71) Applicant: Andrew LLC, Hickory, NC (US)

(72) Inventor: Martin Zimmerman, Chicago, IL (US)

(73) Assignee: CommScope Technologies LLC, Hickory, NC (US)

(*) Notice: Subject to any disclaimer, the term of this patent is extended or adjusted under 35 U.S.C. 154(b) by 57 days.

(21) Appl. No.: 14/355,900

(22) PCT Filed: Dec. 21, 2012

(86) PCT No.: PCT/US2012/071443
§ 371 (c)(1),
(2) Date: May 2, 2014

(87) PCT Pub. No.: WO2013/096880
PCT Pub. Date: Jun. 27, 2013

(65) Prior Publication Data
US 2014/0292451 A1    Oct. 2, 2014

Related U.S. Application Data

(60) Provisional application No. 61/579,031, filed on Dec. 22, 2011.

(51) Int. Cl.
*H01P 5/02* (2006.01)
*H03H 7/00* (2006.01)
(Continued)

(52) U.S. Cl.
CPC ............... *H03H 7/004* (2013.01); *H01P 5/028* (2013.01); *H01Q 1/246* (2013.01); *H05K 1/0225* (2013.01); *H05K 1/0239* (2013.01); *H01L 2924/0002* (2013.01); *H05K 3/28* (2013.01);
(Continued)

(58) Field of Classification Search
CPC .................................... H01P 5/02; H05K 7/02
USPC ................. 333/24 C, 109, 123, 254; 174/541
See application file for complete search history.

(56) References Cited

U.S. PATENT DOCUMENTS 3,089,105 A    5/1963    Alford
3,980,976 A    9/1976    Tadama et al.
(Continued)

FOREIGN PATENT DOCUMENTS

EP    2133954    12/2009
EP    2237439    10/2010
(Continued)

OTHER PUBLICATIONS

Pastor Jimenez, J, International Search Report for PCT/US12/71443, Mar. 20, 2013, European Patent Office, Rijswijk Netherlands.

*Primary Examiner* — Dean Takaoka
(74) *Attorney, Agent, or Firm* — Babcock IP, PLLC

(57) ABSTRACT

A blind-mate capacitive coupling interconnection between a main module enclosure one or more sub-module enclosures has coupling surfaces each with a ground portion and an aperture, an inner element provided in the aperture, spaced away from the ground portion. The coupling surfaces may be provided, for example, as traces on a printed circuit board. To accommodate a degree of mis-alignment, one of the inner elements may be provided larger than the other. Capacitive coupling between the coupling surfaces occurs when the coupling surfaces are mated together, retained in position, for example, by a mechanical fixture.

20 Claims, 8 Drawing Sheets

(51) Int. Cl.
  _H01Q 1/24_  (2006.01)
  _H05K 1/02_  (2006.01)
  _H05K 7/02_  (2006.01)
  _H05K 3/28_  (2006.01)
  _H05K 3/40_  (2006.01)

(52) U.S. Cl.
  CPC ......... _H05K 3/40_ (2013.01); _H05K 2201/0175_ (2013.01); _H05K 2201/09309_ (2013.01); _H05K 2201/09336_ (2013.01); _H05K 2201/09618_ (2013.01); _H05K 2201/09872_ (2013.01)

(56) References Cited

U.S. PATENT DOCUMENTS

| | | | |
|---|---|---|---|
| 4,063,246 A | 12/1977 | Greiser | |
| 4,336,974 A | 6/1982 | Wilson | |
| 4,580,862 A | 4/1986 | Johnson | |
| 4,697,859 A | 10/1987 | Fisher, Jr. | |
| 4,789,351 A | 12/1988 | Fisher, Jr. et al. | |
| 4,815,986 A | 3/1989 | Dholoo | |
| 4,921,435 A | 5/1990 | Kane et al. | |
| 5,329,262 A | 7/1994 | Fisher, Jr. | |
| 5,383,790 A | 1/1995 | Kerek et al. | |
| 5,552,959 A | 9/1996 | Penniman et al. | |
| 5,558,541 A | 9/1996 | Botka et al. | |
| 5,769,652 A | 6/1998 | Wider | |
| 5,796,315 A | 8/1998 | Gordon et al. | |
| 5,905,465 A | 5/1999 | Olson et al. | |
| 5,944,548 A | 8/1999 | Saito | |
| 5,977,841 A | 11/1999 | Lee et al. | |
| 5,980,290 A | 11/1999 | Meynier et al. | |
| 5,997,328 A | 12/1999 | Kodama et al. | |
| 6,173,605 B1 | 1/2001 | Rankin | |
| 6,343,958 B1 | 2/2002 | Wayman | |
| 6,409,550 B1 | 6/2002 | Splichal et al. | |
| 6,414,636 B1 | 7/2002 | Godard et al. | |
| 6,558,177 B2 | 5/2003 | Havener | |
| 6,679,726 B1 | 1/2004 | Tunn et al. | |
| 6,926,555 B2 | 8/2005 | Nelson | |
| 7,077,697 B2 | 7/2006 | Kooiman | |
| 7,121,857 B1 | 10/2006 | Lewis | |
| 7,255,615 B2 | 8/2007 | Woelfl et al. | |
| 7,298,233 B2 * | 11/2007 | Zimmerman | 333/161 |
| 7,459,886 B1 * | 12/2008 | Potanin et al. | 320/135 |
| 7,463,190 B2 * | 12/2008 | Zimmerman | 342/372 |
| 7,474,172 B2 | 1/2009 | Runyon | |
| 7,628,628 B2 | 12/2009 | Matsuda et al. | |
| 8,231,398 B2 | 7/2012 | Rosenberger | |
| 2004/0066249 A1 | 4/2004 | Garner et al. | |
| 2008/0203506 A1 | 8/2008 | David et al. | |
| 2009/0015352 A1 | 1/2009 | Goebel et al. | |
| 2015/0212281 A1 * | 7/2015 | McColloch | 385/59 |

FOREIGN PATENT DOCUMENTS

| | | |
|---|---|---|
| WO | WO0033360 | 6/2000 |
| WO | WO2006064124 | 6/2006 |

\* cited by examiner

CAPACITIVE BLIND-MATE MODULE INTERCONNECTION

BACKGROUND

1. Field of the Invention

This invention relates to electrical interconnections. More particularly, the invention relates to blind mate capacitive coupling interconnections between RF assemblies.

2. Description of Related Art

Interconnection between different RF assemblies, such as between a main module and one or more sub-modules, may require high performance with respect to impedance matching, signal leakage, and/or Passive Intermodulation Distortion (PIM). PIM is a form of electrical interference/signal transmission degradation that may occur as electro-mechanical interconnections shift or degrade over time, for example due to mechanical stress, vibration, thermal cycling, and/or material degradation. PIM is an important interconnection quality characteristic as PIM generated by a single low quality interconnection may degrade the electrical performance of an entire RF system.

Conventional techniques for providing electro-mechanical module interconnections between modules, such as coaxial cable jumpers, can be time-consuming to connect and/or may require special skills, such as soldering and the ability of manipulate components with high precision. Such interconnections may also be fragile and easily damaged if mishandled. These issues may exist during manufacture, initial field installation and/or ongoing maintenance over the life of the installation.

Capacitively coupled interconnections are known in the electrical arts, for example, within RF assemblies between elements of printed circuit boards or within coaxial connector terminations of coaxial cables. Capacitively coupled interconnections may eliminate (i) soldering, (ii) threaded fasteners, (iii) fragile parts that extend outwards from the main body and that are therefore subject to damage in a hostile environment, and (iv) the requirement for precise alignment to achieve high performance.

Competition in the RF Assembly market has focused attention on improving assembly interconnection performance and long term interconnection reliability. Further, reduction of overall costs, including materials, training and installation costs, may be a significant factor for commercial success.

Therefore, it is an object of the invention to provide an interconnection and method of interconnection that overcomes deficiencies in the prior art.

BRIEF DESCRIPTION OF THE DRAWINGS

The accompanying drawings, which are incorporated in and constitute a part of this specification, illustrate embodiments of the invention, where like reference numbers in the drawing figures refer to the same feature or element and may not be described in detail for every drawing figure in which they appear and, together with a general description of the invention given above, and the detailed description of the embodiments given below, serve to explain the principles of the invention.

DETAILED DESCRIPTION

The inventor has recognized that PIM may be reduced and a blind-mate interconnection characteristic realized by providing generally planar capacitive coupling interconnection surfaces between a main module and one or more sub-modules coupled thereto.

Figure 1:
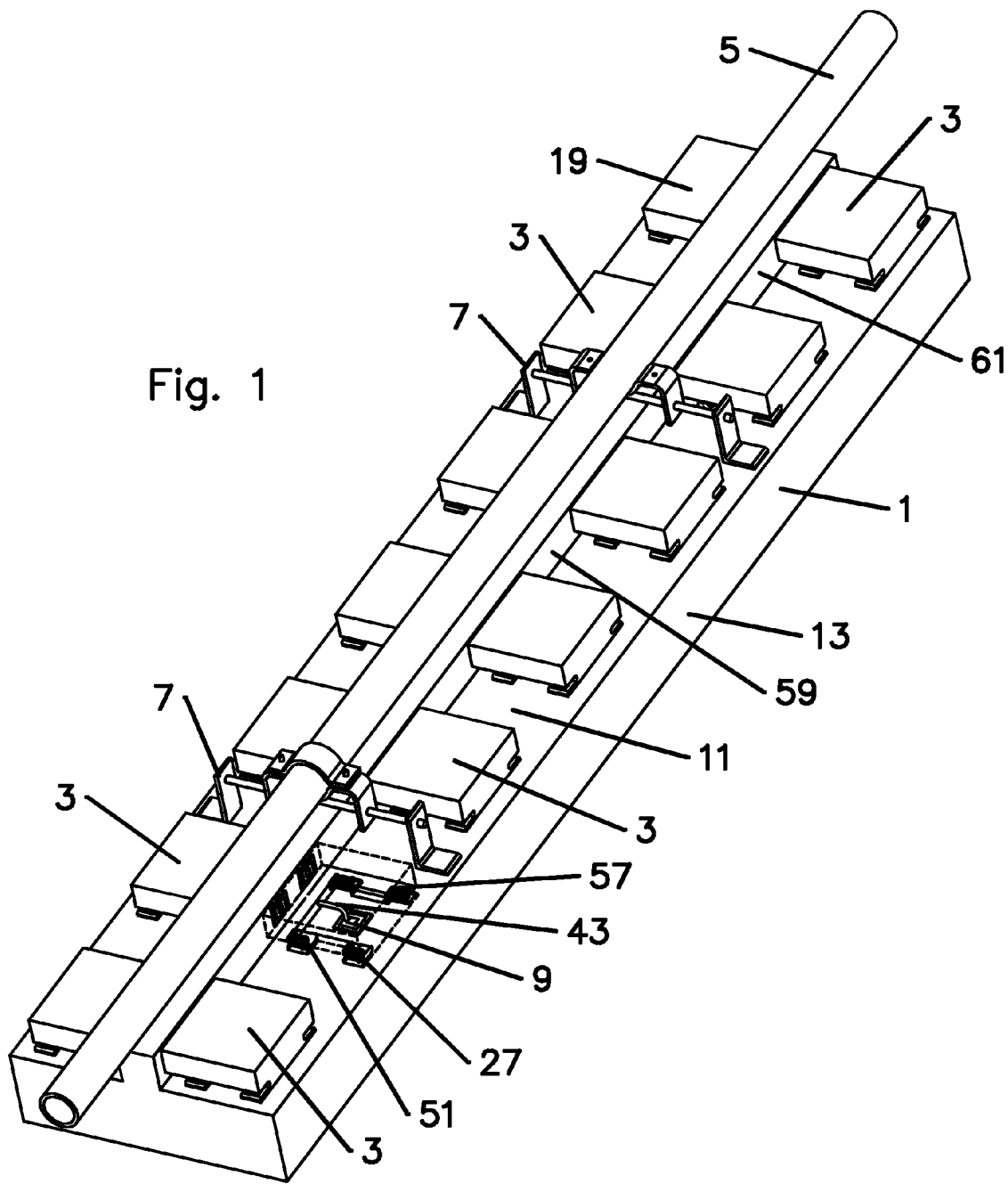
FIG. 1 is a schematic angled isometric view of an exemplary embodiment of a main module with a plurality of sub-modules attached, one of the sub-modules shown as transparent to demonstrate the coupling surfaces.
Figure 2:
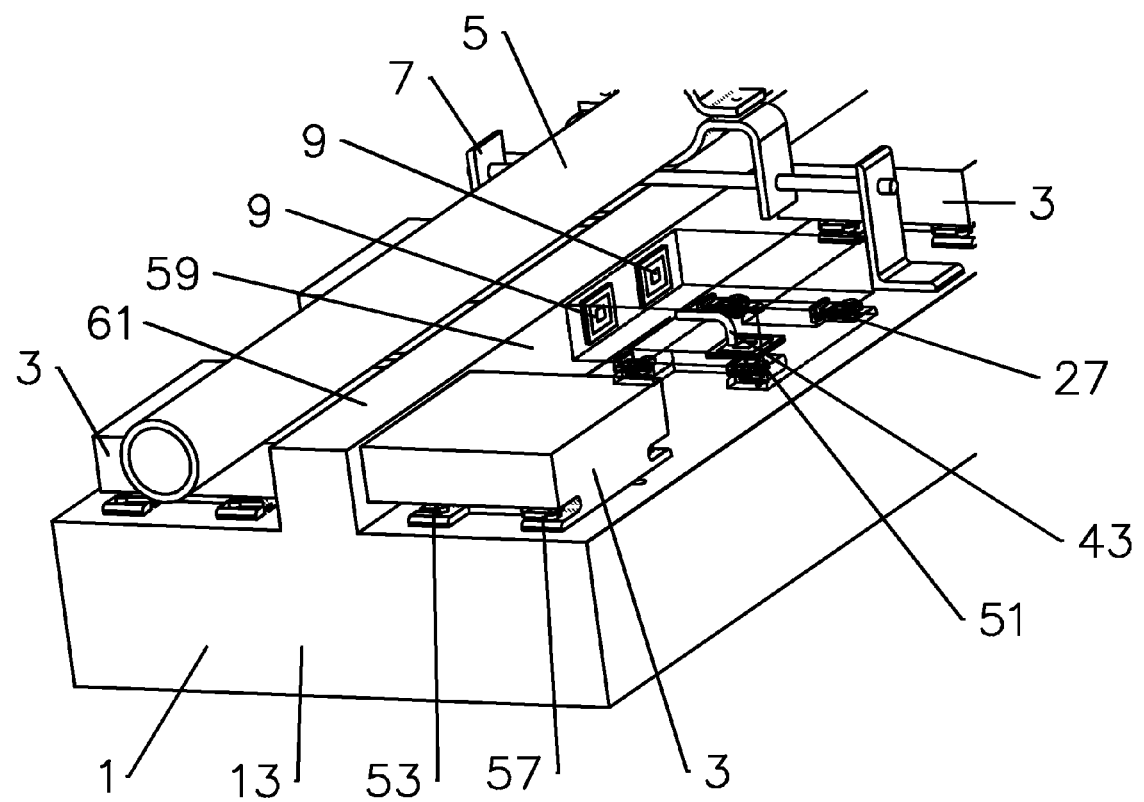
FIG. 2 is a partial close-up view of the assembly of FIG. 1.

An exemplary capacitively coupled blind mate interconnection is demonstrated in FIGS. 1 and 2, wherein the main module 1 is an active antenna array with a plurality of field exchangeable interconnected sub-assemblies 3, such as transceiver modules. The main module 1 is demonstrated with typical mounting hardware, including a mounting pole 5 and mounting brackets 7. One skilled in the art will appreciate that it is advantageous for assembly, installation and/or maintenance operations to enable blind mating connection and disconnection between the main module 1 and each sub-module 3, without interfering with the adjacent sub-modules 3, main module brackets 7 and/or nearby structures, such as the mounting pole 5 or walls the main module may alternatively be mounted upon.

RF signals may be passed between the main module 1 and each sub-module 3 across one or more main module capacitive coupling surfaces 9 provided on a main module outer surface 11 of the main module enclosure 13. Each main module capacitive coupling surface 9 mates with a respective sub-module capacitive coupling surface 15 provided on a sub-module outer surface 17 of a sub-module enclosure 19.

Figure 3:
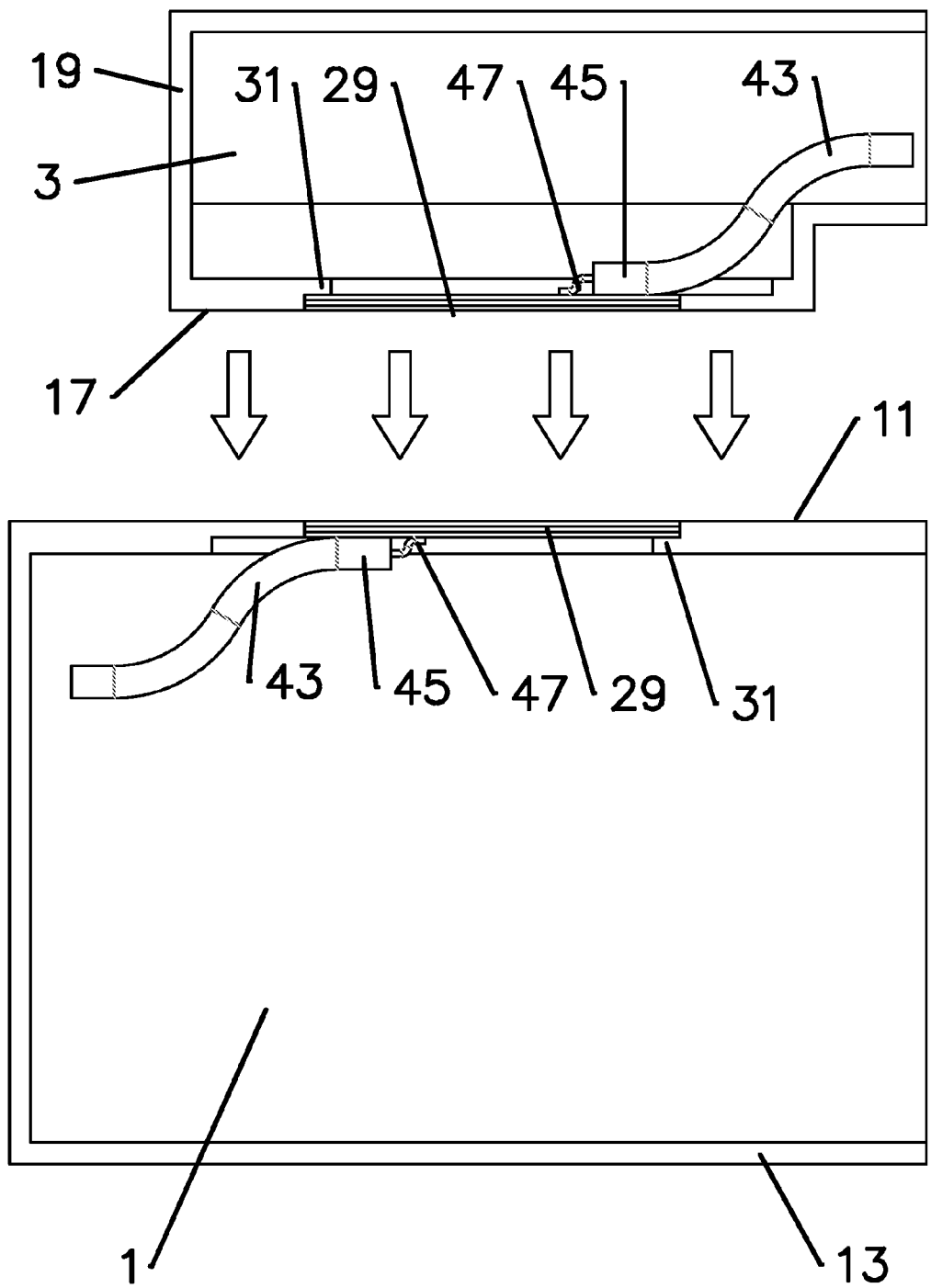
FIG. 3 is a schematic simplified cut-away side view of a main module according to FIG. 1 with a sub-assembly positioned for mating along the direction of the arrows.
Figure 4:
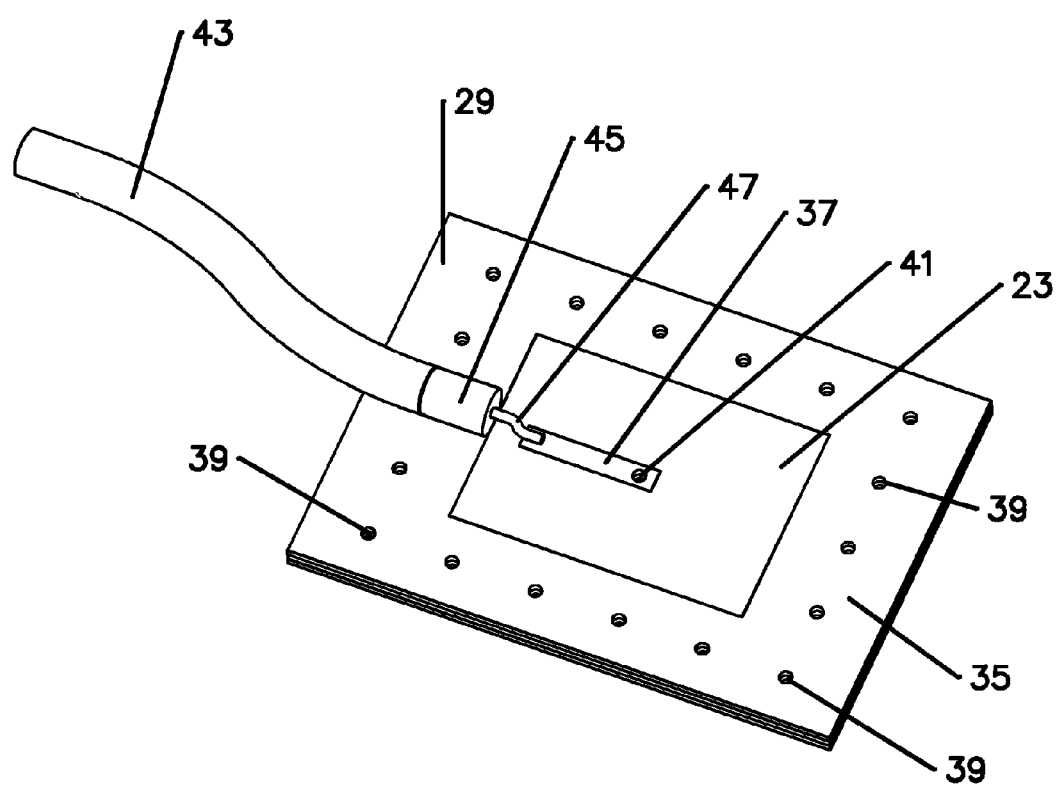
FIG. 4 is a schematic isometric cut-away top side view of a printed circuit board coupling surface embodiment.
Figure 5:
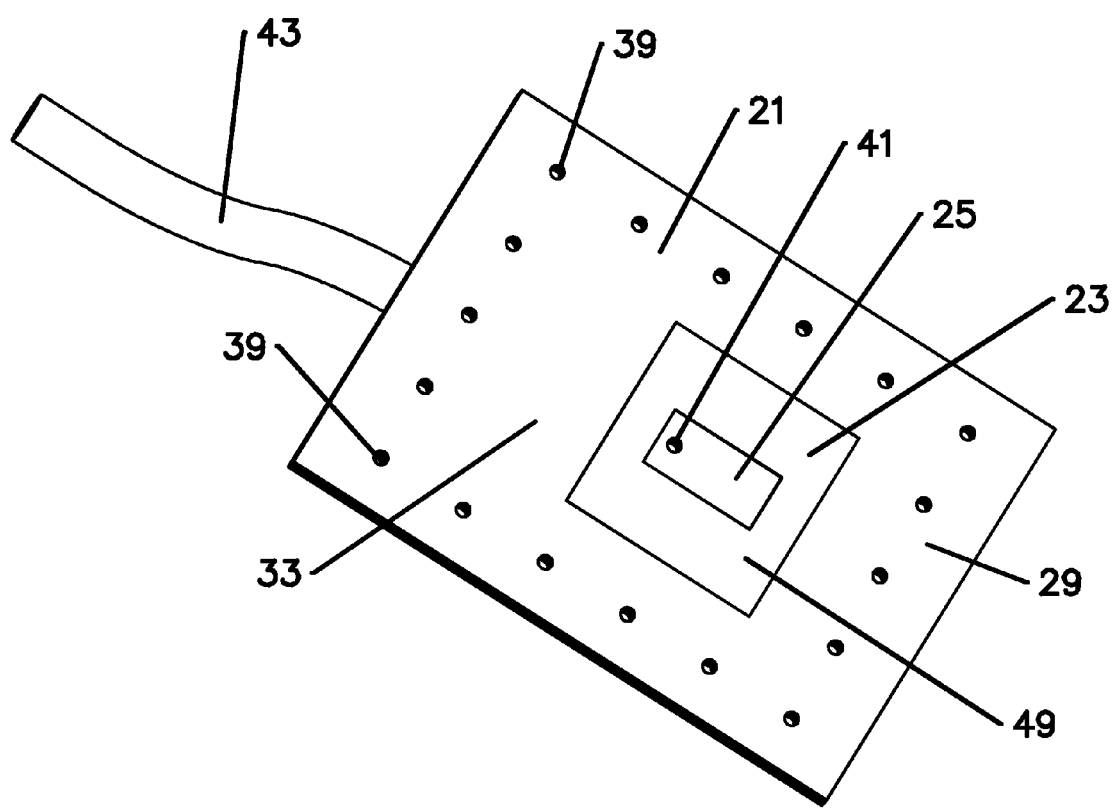
FIG. 5 is a schematic isometric cut-away bottom side view of a printed circuit board coupling surface embodiment dimensioned to mate with the coupling surface of FIG. 4. Note the inner element is enlarged, compared to the inner element of FIG. 4.

As shown for example in FIGS. 3-5, the main module and sub-module capacitive coupling surfaces 9, 15 may be provided as generally planar, with a ground portion 21 surrounding an aperture 23. An inner element 25 is provided within the aperture 23 of the main module capacitive coupling surfaces 9, electrically isolated from the ground portion 21. Similarly, an inner element 25 is provided within the aperture 23 of the sub-module capacitive coupling surface 15, electrically isolated from the ground portion 21 of the sub-module capacitive coupling surface 15.

To reduce mating precision requirements between the main and sub-module coupling surface pairs one of the inner elements 25 of the main module or sub-module may be provided larger than the other. Thereby, as long as the smaller of the two inner elements 25 remains situated within the extent of the coupling surface featuring the larger inner element 25, the capacitive coupling characteristics of the interconnection therebetween may have reduced variability, reducing the necessary precision of the coupling surface seating within their respective enclosures and/or mechanical fixtures 27 applied to retain them mated together. One skilled in the art will appreciate that the elements forming the main module and sub-module capacitive coupling surfaces 9,15 are readily exchangeable with one another as pairs in equivalent configurations where the larger inner element 25 is provided on either of the coupling surfaces. Similarly, the adjacent areas of the apertures 23 and/or ground portions 21 are not required to align precisely, other than to be contiguous and at least spaced away from the inner elements 25.

The main module capacitive coupling surface 9 and/or the sub-module capacitive coupling surface 15 may be cost effectively provided with high precision as a generally planar printed circuit board 29 where the ground portion 21 is a peripheral trace portion of the printed circuit board 29 surrounding the aperture 23 within which the inner element 25 is isolated from the ground portion 21 as another trace. The ground portion 25 may be coupled to the surrounding outer surfaces of the respective main module and sub-module(s) 9,15 by direct contact, for example by providing an overhanging lip 31 which a peripheral portion of the top layer ground trace 35 seats against. Further, the main and sub-module enclosures 13,19 surrounding the printed circuit board 29 may structurally reinforce the coupling surfaces.

One skilled in the art will appreciate that capacitive coupling performance is a function of the RF signal frequency, coupling surface area and distance between the coupled surfaces. To minimize the distance between the coupled surfaces, the ground portion 21 and the inner element 25 may be provided on a bottom layer 33 of the printed circuit board 29; the ground portion 21 and the inner element 25 electrically coupled to a top layer ground trace and a top layer inner element trace, respectively, of a top layer of the printed circuit board by at least one ground via and at least one inner element via, respectively. Thereby, further electrical connections with respect to the coupling surfaces may be located entirely internal to their respective enclosures. For example, a coaxial cable 43 with the outer conductor 45 coupled to the top layer ground trace 35 and the inner conductor 47 coupled to the top layer inner element trace 37 may be utilized to route RF signals passing between the coupling surfaces for further distribution within the enclosures.

To inhibit any direct metal-to-metal electrical interconnection between the main module and the sub-modules across the capacitive coupling surfaces, the bottom layer 33 of the printed circuit board 29 may be cost effectively provided with dielectric spacer 49 with a generally uniform thickness, such as a non conductive conformal coating or other dielectric layer, such as solder mask, paint or dry film.

Figure 6:
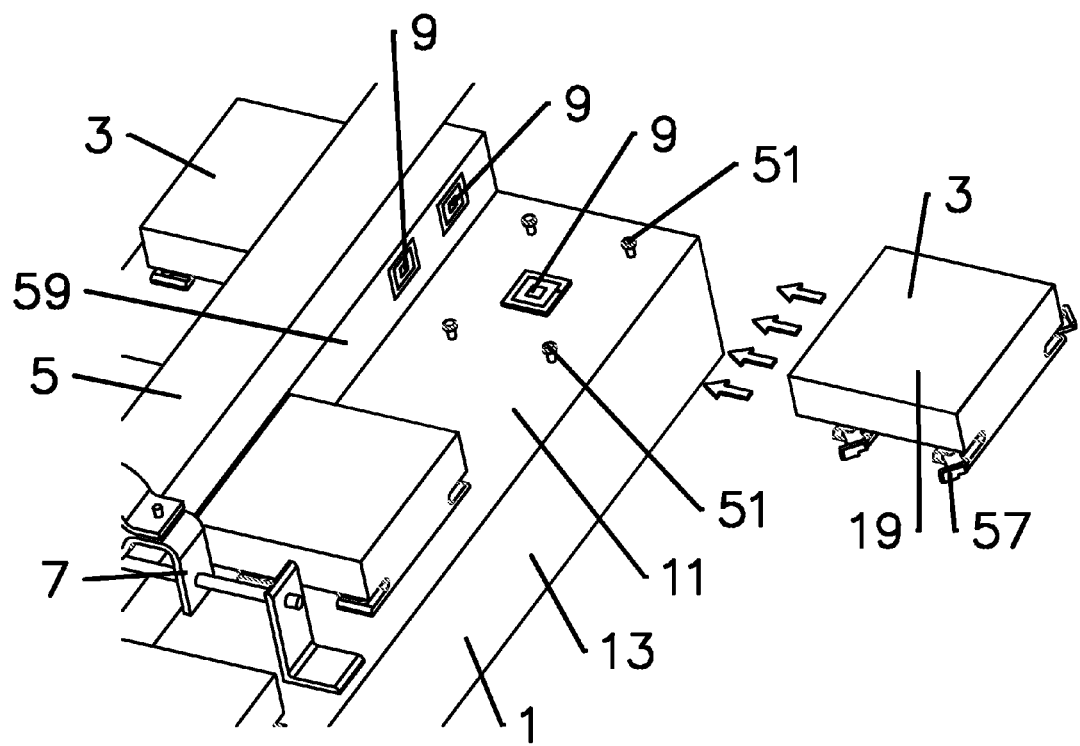
FIG. 6 is a close-up isometric view of a portion of the assembly of FIG. 1, demonstrating alignment and direction of mating of a sub-module, prior to interconnection.
Figure 7:
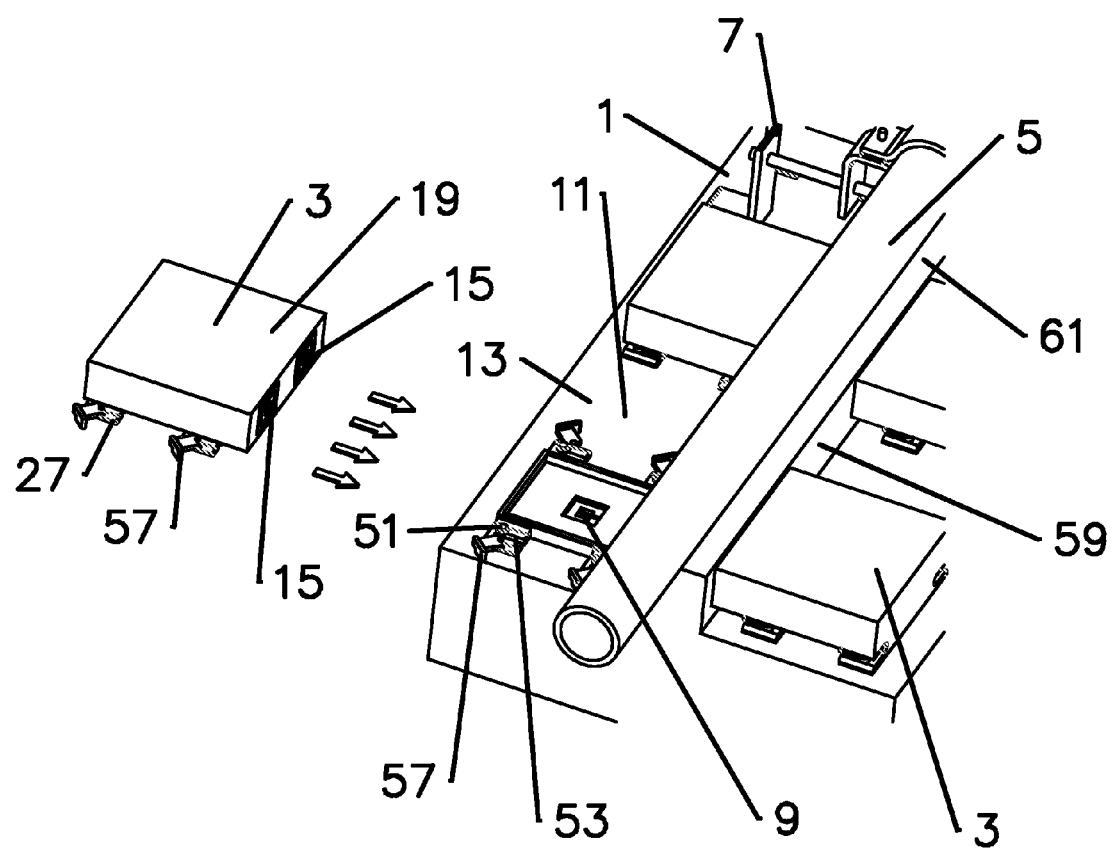
FIG. 7 is an alternate angle schematic view of FIG. 6, also demonstrating the seating of a bottom portion of the sub-module enclosure with the main module mechanical fixtures.
Figure 8:
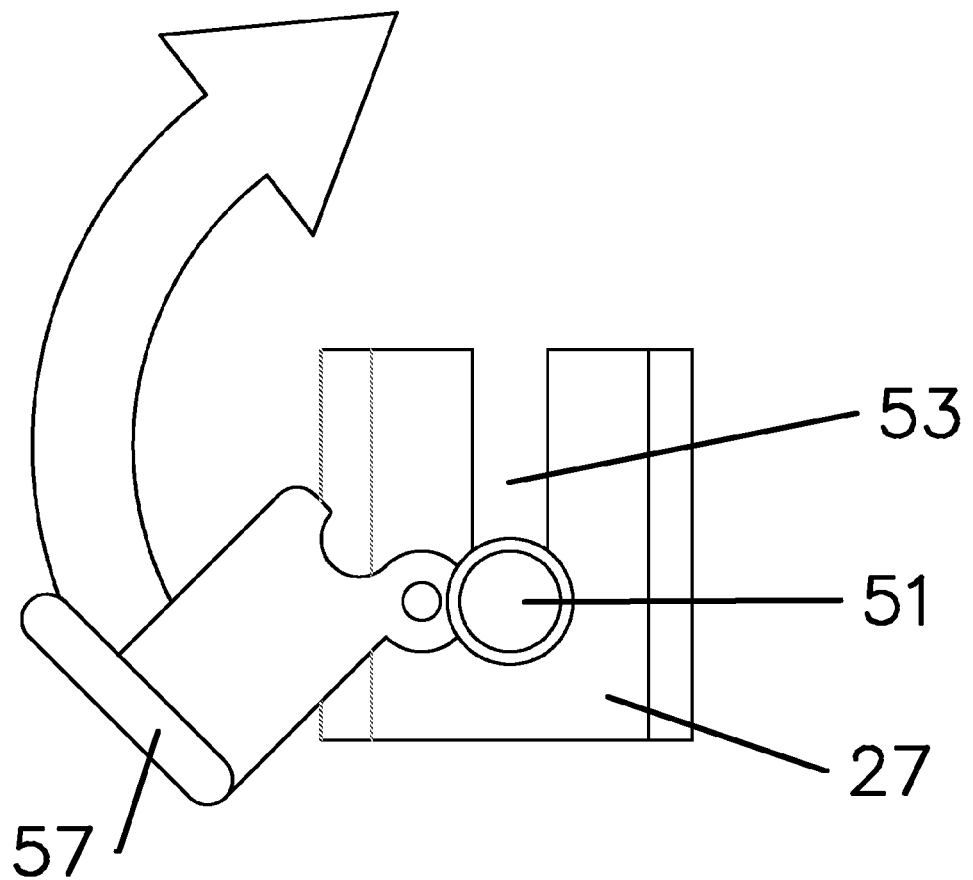
FIG. 8 is a schematic top view of a mechanical fixture, prior to rotation of the locking mechanism.
Figure 9:
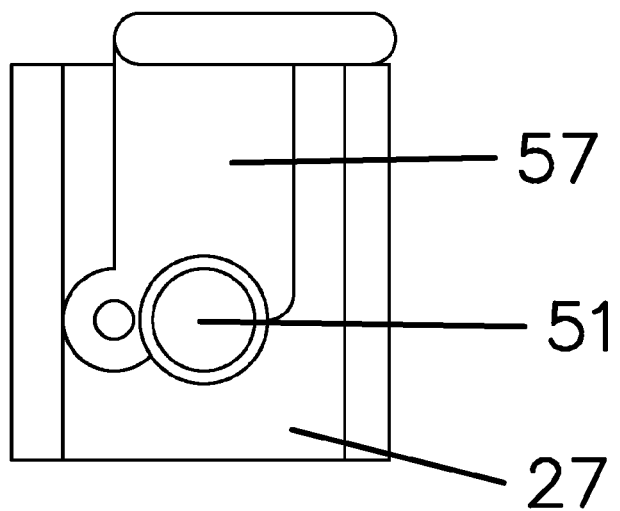
FIG. 9 is a schematic top view of the mechanical fixture, with the locking mechanism in the rotated and locked position.

The main module and sub-module coupling surfaces 9,15 may be retained against one another by a mechanical fixture 27. For example as shown in FIGS. 6 and 7, the mechanical fixture 27 may be provided as at least one stud 51 projecting from the main module enclosure 13, the stud 51 dimensioned to engage a slot 53 of the sub-module outer surface 17. To improve retention and/or long term alignment a plurality of the studs 51 and slots 53 may be positioned proximate a periphery of the bottom surface 55 of the sub-module 3. Alternatively and/or additionally, the studs 51 and slots 53 may be positioned spaced away from the coupling surfaces, to minimize any electrical interference the coupling of the studs 51 and slots 53 may generate. A locking mechanism 57, alternatively rotatable to enable slot 53 insertion and then to secure the stud 51 within the slot 53, for example as shown in FIGS. 8 and 9, may be applied to retain the mechanical fixture 27 in locked or unlocked positions.

Multiple pairs of main module and sub-module coupling surfaces 9,15 may be applied with respect to a single sub-module 3, as demonstrated in FIGS. 1, 2, 6 and 7. For example, multiple coupling surfaces may be applied to the same surface, coplanar with one another, such as a sidewall 59 or bottom surface 55 of the sub-module 3 and corresponding main module outer surface 11. Alternatively, for example where one coupling surface is provided on the bottom surface 55 and one on the sidewall surface 59, the coupling surfaces are provided normal to one another. The main module surface corresponding to the sidewall may be, for example, the sidewall of a channel 61 projecting from the main module outer surface 11. The channel 61 may be, for example, a waveguide extending along the main module outer surface 11, communicating the signals transmitted therethrough to a desired group of the plurality of sub-modules 3.

Depending upon the alignment of the coupling surfaces, an insertion direction during mating may be either parallel or orthogonal to the corresponding capacitive coupling surface, guided by the engagement of the selected mechanical fixture, such as stud(s) 51 into slot(s) 53.

Accordingly, in a method for forming the interconnection, the installer need only slide the sub-module 3 into the desired position, so that the, for example, slots 53 engage the studs 51. When the stud 51 bottoms in the slot 53, the coupling surfaces will be aligned and the locking mechanism(s) 57 may be rotated to the locked position to secure the sub-module 3 in place upon the main module 1, each of the capacitive coupling surface pairs aligned with one another.

One skilled in the art will appreciate that the blind mate module to module interconnection eliminates the need for coaxial jumpers and the like, which may significantly simplify interconnection manufacture, improve electrical performance and reliability as well as reduce assembly total size requirements and manufacturing cost.

| Table of Parts | |
|---|---|
| 1 | main module |
| 3 | sub-module |
| 5 | mounting pole |
| 7 | mounting bracket |
| 9 | main module capacitive coupling surface |
| 11 | main module outer surface |
| 13 | main module enclosure |
| 15 | sub-module capacitive coupling surface |
| 17 | sub-module outer surface |
| 19 | sub-module enclosure |
| 21 | ground portion |
| 23 | aperture |
| 25 | inner element |
| 27 | mechanical fixture |
| 29 | printed circuit board |
| 31 | lip |
| 33 | bottom layer |
| 35 | top layer ground trace |
| 37 | top layer inner element trace |
| 39 | ground via |
| 41 | inner element via |
| 43 | coaxial cable |
| 45 | outer conductor |
| 47 | inner conductor |
| 49 | dielectric spacer |
| 51 | stud |
| 53 | slot |
| 55 | bottom surface |
| 57 | locking mechanism |

-continued

Table of Parts

| | |
|---|---|
| 59 | sidewall surface |
| 61 | channel |

Where in the foregoing description reference has been made to materials, ratios, integers or components having known equivalents then such equivalents are herein incorporated as if individually set forth.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus, methods, and illustrative examples shown and described. Accordingly, departures may be made from such details without departure from the spirit or scope of applicant's general inventive concept. Further, it is to be appreciated that improvements and/or modifications may be made thereto without departing from the scope or spirit of the present invention as defined by the following claims.

I claim:

1. A blind-mate capacitive coupling interconnection between a main module enclosure and a sub-module enclosure, comprising:
   a first main module capacitive coupling surface provided on a main module outer surface of the main module enclosure;
   a first sub-module capacitive coupling surface provided on a sub-module outer surface of the sub-module enclosure; the main module capacitive coupling surface and the sub-module capacitive coupling surface each provided with a ground portion with an aperture;
   a main module inner element provided within the aperture of the main module capacitive coupling surface, electrically isolated from the ground portion of the main module capacitive coupling surface;
   a sub-module inner element provided within the aperture of the sub-module capacitive coupling surface, electrically isolated from the ground portion of the sub-module capacitive coupling surface; and
   a mechanical fixture dimensioned to retain the sub-module capacitive coupling surface against the main module capacitive coupling surface.

2. The interconnection of claim 1, wherein the main module capacitive coupling surface and the sub-module capacitive coupling surface are generally planar.

3. The interconnection of claim 1, wherein one of the main module inner element and the sub-module inner element is larger than the other.

4. The interconnection of claim 1, wherein at least one of the main module capacitive coupling surface and the sub-module capacitive coupling surface is a printed circuit board.

5. The interconnection of claim 4, wherein a bottom layer of the printed circuit board has a non-conductive conformal coating.

6. The interconnection of claim 4, wherein the ground portion and the inner element are provided on a bottom layer of the printed circuit board; the ground portion and the inner element electrically coupled to a top layer ground trace and a top layer inner element trace of a top layer of the printed circuit board by at least one ground via and at least one inner element via.

7. The interconnection of claim 6, wherein an outer conductor of a coaxial cable is coupled to the top layer ground trace and an inner conductor of the coaxial cable is coupled to the top layer inner element trace.

8. The interconnection of claim 1, wherein the mechanical fixture is at least one stud projecting from the main module enclosure, the stud dimensioned to engage a slot of the sub-module outer surface.

9. The interconnection of claim 8, wherein the at least one slot is provided with a locking mechanism rotatable to secure the stud within the slot.

10. The interconnection of claim 1, further including a second main module capacitive coupling surface provided on the main module outer surface; and
    a second sub-module capacitive coupling surface provided on the sub-module outer surface.

11. The interconnection of claim 10, wherein the first and the second main module capacitive coupling surfaces are co-planar.

12. The interconnection of claim 10, wherein the first and the second main module capacitive coupling surfaces are provided normal to one another.

13. The interconnection of claim 1, wherein the sub-module mates with the main module in a direction one of parallel and orthogonal to the main module capacitive coupling surface.

14. The interconnection of claim 1, wherein the main module capacitive coupling surface is provided on a sidewall of a channel projecting from the main module outer surface.

15. The interconnection of claim 1, wherein the ground portion of the main module capacitive coupling surface is electrically coupled to the main module outer surface.

16. The interconnection of claim 1, wherein the ground portion of the sub-module capacitive coupling surface is electrically coupled to the sub-module outer surface.

17. The interconnection of claim 1, wherein the main module enclosure is an active antenna and the sub-module is a transceiver module.

18. A method for forming a blind-mate capacitive coupling interconnection between a main module enclosure and a sub-module enclosure, comprising the steps of:
    providing a first main module capacitive coupling surface provided on a main module outer surface of the main module enclosure;
    providing a first sub-module capacitive coupling surface provided on a sub-module outer surface of the sub-module enclosure; the main module capacitive coupling surface and the sub-module capacitive coupling surface each provided with a ground portion with an aperture;
    providing a main module inner element within the aperture of the main module capacitive coupling surface, electrically isolated from the ground portion of the main module capacitive coupling surface;
    providing a sub-module inner element provided within the aperture of the sub-module capacitive coupling surface, electrically isolated from the ground portion of the sub-module capacitive coupling surface;
    providing a mechanical fixture dimensioned to retain the sub-module capacitive coupling surface against the main module capacitive coupling surface; and
    mating the sub-module capacitive coupling surface against the main module capacitive coupling surface.

19. The method of claim 18, wherein the mating with the main module is along a direction one of parallel and orthogonal to the main module capacitive coupling surface.

20. The method of claim 18, wherein the mating positions the sub-module capacitive coupling surface parallel to the main module capacitive coupling surface.

\* \* \* \* \*